United States Patent [19]

Okumura et al.

[11] 3,764,864

[45] Oct. 9, 1973

[54] INSULATED-GATE FIELD-EFFECT TRANSISTOR WITH PUNCH-THROUGH EFFECT ELEMENT

[75] Inventors: Tomisaburo Okumura; Akira Tsuchitani; Toshio Hasegawa, all of Kyoto, Japan

[73] Assignee: Matsushita Electronics Corporation, Kadoma-shi, Osaka, Japan

[22] Filed: Mar. 21, 1967

[21] Appl. No.: 624,920

[30] Foreign Application Priority Data

Mar. 29, 1966 Japan .............................. 41/20212

[52] U.S. Cl. ..... 317/235 R, 317/235 B, 317/235 G, 317/235 E, 307/304, 307/303

[51] Int. Cl. ....................... H01l 11/00, H01l 15/00

[58] Field of Search ..................... 317/235, 234, 22, 317/22.1, 21.1; 307/303, 304, 305

[56] References Cited

UNITED STATES PATENTS

| | | | |
|---|---|---|---|
| 3,191,061 | 6/1965 | Weimer | 317/235 |
| 3,278,853 | 10/1966 | Lin | 317/235 |
| 3,395,290 | 7/1968 | Farina et al. | 317/235 |
| 3,403,270 | 9/1968 | Pace et al. | 307/304 |
| 3,408,543 | 10/1968 | Ono et al. | 317/235 |
| 3,416,008 | 12/1968 | Memelink et al. | 317/235 |
| 3,447,046 | 5/1969 | Cricchi et al. | 317/235 |
| 3,448,344 | 6/1969 | Schuster et al. | 317/235 |
| 3,313,958 | 4/1967 | Bowers | 307/229 |

OTHER PUBLICATIONS

Electronics published Sept. 6, 1965, Vol. 38, page 155

*Primary Examiner*—John W. Huckert
*Assistant Examiner*—Andrew J. James
*Attorney*—Stevens, Davis, Miller & Mosher

[57] ABSTRACT

An insulated gate field-effect transistor constructed by forming, in a portion of the semiconductor substrate close to the source region, a region which constitutes a p-n junction with the substrate, and by connecting this latter region to the gate electrode, whereby there is caused, between said region and the source, a current due to punch-through at high gate voltage so that the breakdown of the transistor is prevented.

12 Claims, 8 Drawing Figures

INSULATED-GATE FIELD-EFFECT TRANSISTOR WITH PUNCH-THROUGH EFFECT ELEMENT

The present invention relates to an insulated-gate field-effect transistor, and more particularly to an insulated-gate field-effect transistor which is protected from permanent breakdown due to the dielectric breakdown of the gate oxide thereof.

A conventional insulated-gate field-effect transistor sometimes undergoes permanent breakdown due to the dielectric breakdown of the gate oxide thereof.

Therefore, it is an object of the present invention to provide an insulated-gate field-effect transistor free from such permanent breakdown.

Acording to the present invention, such permanent breakdown of the insulated-gate field-effect transistor is prevented by forming a diode, i.e., a region forming a p-n junction with the semiconductor wafer, capable of bypassing a current to limit the voltage to be applied to the gate oxide in the same wafer in which the transistor is formed.

Although the concept of the present invention is applicable to all kinds of insulated-gate field-effect transistors, it is particularly advantageous when applied to a transistor having two or more gates.

Now, the present invention will be described in detail with reference to the accompanying drawings, in which.

Figure 5:
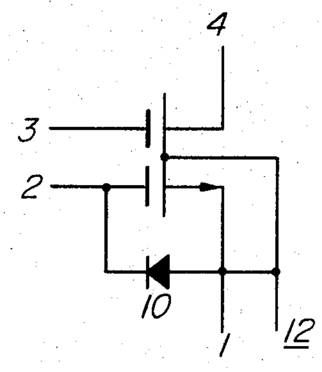
FIGS. 5 and 6 are explanatory diagrams of field-effect transistors each having two gates according to the invention.
Figure 7A:
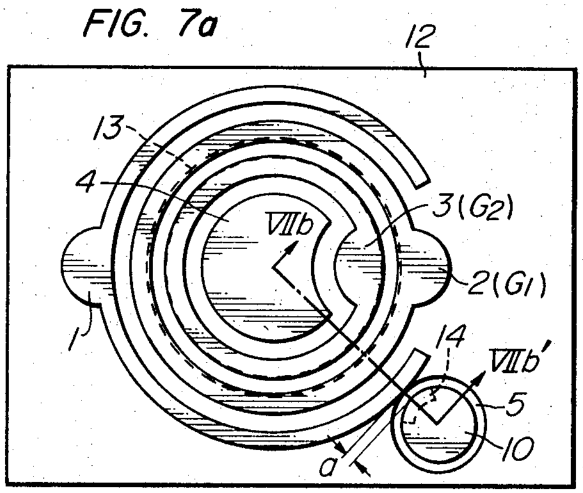
Figure 6:
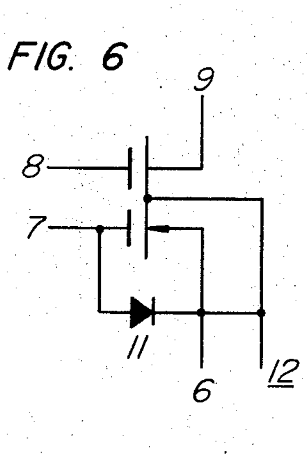
Figure 7B:
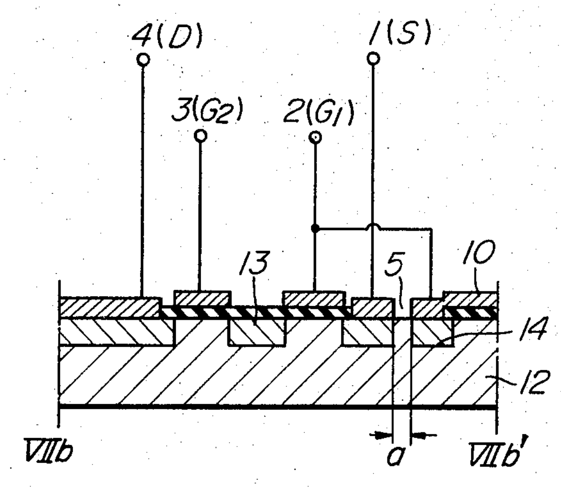

FIG. 7*a* is a plan view of an embodiment of the transistor of FIG. 5 or 6; and FIG. 7*b* is a cross-secton of the transistor of FIG. 7*a* taken along the line 7*b*–7*b'* in which outer lead wires are provided.

The present invention will be described with reference to a field-effect transistor with two insulated-gates by way of example.

Figure 1:
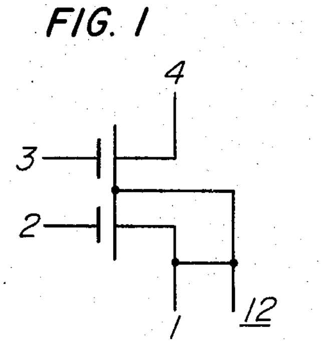
FIG. 1 is an explanatory diagram of an n-channel insulated-gate field-effect transistor having two gates.
Figure 2:
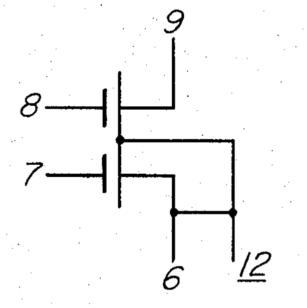
FIG. 2 is an explanatory diagram of a p-channel insulated-gate field-effect transistor having two gates.

In FIGS. 1 and 2, showing an n-channel type and a p-channel type insulated-gate field-effect transistors, respectively, reference numeral 1 or 6 represents a source, 2 or 7 represents a control gate or the first gate $G_1$ provided adjacent to the source 1 or 6 and controlling carriers, 4 or 9 represents a drain, 3 or 8 designates a screen gate or the second gate $G_2$ provided adjacent to the drain 4 or 9, and 12 designates a substrate region. Thus, as a result of provision of the screen gate, the electrostatic capacity between the control gate and the drain is reduced by one several tenth, with resultant facility for use in high frequency regions. Moreover, by impressing signals on the control gate and the screen gate, the field of use of the insulated-gate field-effect transistor was very much expanded.

Figure 3:
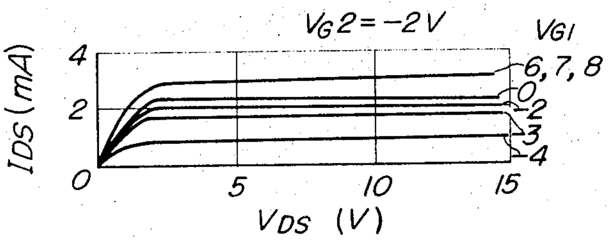
FIGS. 3 and 4 are diagrams showing the characteristics of the transistors of FIGS. 1 and 2, respectively.
Figure 4:
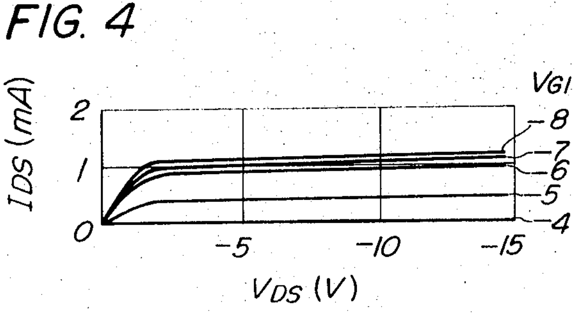

Of these applications, one interesting application relies on the fact that when the screen gate voltage $V_{G2}$ is selected at appropriate values, the drain current is saturated for any control gate voltage $V_{G1}$ as shown in FIGS. 3 and 4 in which the screen gate voltage $V_{G2}$ is set at −2 volts. FIG. 3 illustrates a characteristic of an n-channel type double gate MOS transistor, and FIG. 4 a characteristic of a p-channel type double gate MOS transistor.

The MOS transistor is the most familiar one among the insulated-gate field-effect transistors. This transistor uses silicon as the semiconductor material, and $SiO_2$ as the gate insulator.

As shown in FIGS. 3 and 4, by selecting the screen gate voltage $V_{G2}$ appropriately, the maximum drain current $I_{DS}$ may be altered depending on the control gate voltage $V_{G1}$. Such maximum drain current decreases as the screen gate $G_2$ decreases in the n-channel type, and as the latter approaches positive potential in the p-channel type. As the maximum $L_{DS}$ is limited as above, fear of damage due to an over-current is completely banished in this transistor. However, one cause for damage remains, that is the dielectric breakdown of the gate insulator owing to too large a voltage imposed on the control gate $G_1$.

This invention provides an effective means for the prevention of dielectric breakdown of the control gate $G_1$, in the insulated-gate field-effect transistor.

In FIGS. 5 and 6, like numerals designate like parts as in FIGS. 1 and 2 respectively. In principle, according to the present invention, the dielectric breakdown is prevented by connecting a diode, i.e., a region including a p-n junction between the control gate $G_1$ and the source. In the present invention, actually such a diode is formed in the same semiconductor wafer in which the transistor is formed. More particularly, this diode is inserted between the semiconductor wafer and the control Gate $G_1$. Therefore, in reality the diode is connected to the control gate $G_1$ and through the wafer 12 to the source. In connecting the diode, the diode 10 is inserted in the forward direction from the source to the control gate $G_1$ in the n-channel type insulated-gate field-effect transistor as shown in FIG. 5, whereas the diode 11 is in the reverse direction in the p-channel type insulated-gate field-effect transistor as shown in FIG. 6.

In the present invention, such a diode is formed in the same semiconductor wafer in which the transistor is formed. More particularly, this diode is inserted between the semiconductor substrate and the control gate $G_1$.

The region forming a junction with the semiconductor substrate is located in close vicinity to the source, and hence when the potential difference between the source and the control gate $G_1$ grows large, high electric field regions are continuously formed in the wafer from the diode region to the source due to the phenomenon called punch-through, resulting in a large current flowing through the diode region. In the n-channel type insulated-gate field-effect transistor, if the control gate $G_1$ is set positive, the drain current increases, but this increase is suppressed by the screen gate $G_2$ potential as described above. On the other hand, the dielectric breakdown of the control gate $G_1$ due to the voltage increase is prevented, because, since a current begins to flow between the source and the control gate through the diode region before the breakdown voltage of the control gate is reached and, if a resistance is inserted in series with the control gate $G_1$, a voltage drop takes place. Thus, the transistor is protected from any damage.

In the p-channel type insulated-gate field-effect transistor, as the control gate $G_1$ potential rises in the negative direction, the drain current increases. However, the increase in the drain current is suppressed by the screen gate $G_2$ potential, and further increase in the voltage between the control gate $G_1$ and the source is prevented by the flow of current through the diode 11.

It is to be noted that such a breakdown protective diode can easily be produced in the same wafer in which the transistor is formed. In the n-channel type insulated-gate field-effect transistor, the substrate is p-type and the source and the drain n-type. Thus, as is evident from the polarity of the diode 10 as shown in FIG. 5, the diode 10 has only to be formed simultaneously with the source and the drain in one process.

In the p-channel type transistor, since the substrate is of n-type, the source, drain and the diode 11 can to be prepared simultaneously. The diode 10 or 11 is thus provided on the same substrate without any additional process.

In the following are given applications of this invention to the MOS transistor.

Example 1:

In the MOS transistor shown in FIGS. *7a* and *7b* p-type silicon with 6Ω-cm is employed as a semiconductor substrate, and an oxide film 2,000 A. thick formed by thermal oxidation of silicon as a gate oxide film. The breakdown voltage of such a gate oxide film was 120 volts.

Intermediary between the source 1 and the drain 4 and under the oxide film, a region 13 having a width of 10μ and of the same conductivity type as the source and drain was formed. This region is called an island. The island reduces the length of the channel. The distances between the source 1 and the insland 13 and between the island 13 and the drain 4 were equally set at 8μ. The diode 10 inserted between the control gate $G_1$ and the source through the intermediary of the substrate was 20 × 10μin size, and formed a p-n junction 14 with the substrate 12. An annular portion 5 from which the oxide film is removed was provided so that the periphery of the diode 10 was not connected with the source 1 through the oxide. The minimum distance *a* between the diode n-type region and the source 1 was 6μ. The connection between the diode n-type region and the control gate $G_1$ was made with a metal wire. The source 1, the drain 4, the island 13 and the diode n-type region were all produced by diffusing phosphorus. The depth of diffusion was controlled to be 1μ. For improvement in stability, phosphorus was slightly diffused into the oxide film. The pinchoff voltage of such a transistor was about ×1 volt, and this transistor was suitable for the enhance mode wherein the control gate $G_1$ was set positive. When the voltage of the control gate $G_1$ was increased to reach 60 volts, the punch-through took place between the control gate $G_1$ and th source through the diode. The voltage reached was sufficiently lower than the dielectric breakdown voltage of the gate oxide film, and the permanent breakdown due to dielectric breakdown of the oxide film proved to be sufficiently prevented.

Example 2:

As the semiconductor substrate, n-type silicon with 6Ω-cm was used, and as the gate oxide film, 2,000 A. film made by thermal oxidation of silicon was employed.

Dimensions of the MOS transistor produced in this way were identical to those of the n-channel type MOS transistor described in Example 1. To provide the source, the drain, the island and the diode junction, boron was diffused by employing boron oxide. The depth of diffusion was 1μ. The p-channel MOS transistor produced in this way was in the enhancement mode, and the drain current flowed by setting the gate negative relative to the source. In the p-channel type, a negative voltage is impressed also on the drain relative to the source. As the voltage of the control gate $G_1$ increased in the negative direction, the punch-through took place at the absolute value of 20 volts on the average.

This voltage is lower enough than the dielectric breakdown voltage of the oxide to enable effective prevention of the dielectric breakdown of the gate.

It is clear from the aforementioned description that this invention is applicable without imposing any limitation on the semiconductor material, the insulating film material and the electrode metal material. Accordingly, it is to be understood that such semiconductor materials as silicon, germanium, gallium arsenide, etc. are usable, and silicon dioxide, silicon monoxide, magnesium fluoride, silicon nitride, etc. may serve as the insulating film.

What is to be specifically given attention to is that while this invention has been explained with reference to insulated-gate transistors having two or more gates in which a diode is inserted between the gate and the source for prevention from dielectric breakdown, if this invention is applied to an ordinary insulated-gate field-affect transistor having only a single gate, a remarkable advantage results. It is an accident resulting in breakdown often experienced when assembling and adjusting a circuit employing a single gate transistor to apply a voltage between the gate and the source thereof without giving voltage between the source and drain. According to the present invention, such breakdown is effectively prevented. As such, this invention is effectively applicable to all kinds of insulated-gate field-effect transistors regardless of the number of gates incorporated therein.

We claim:

1. An insulated-gate field-effect transistor formed in a semiconductor wafer of one conductivity type, comprising source and drain regions of a different conductivity type formed in said wafer, and at least one gate disposed on said wafer with an insulator layer interposed therebetween, characterized in that a separate region having said different conductivity type is provided in said wafer, said separate region forming a P-n junction with said wafer in the vicinity of said source region, said separate region being connected with one of said at least one gate by means of a lead wire, whereby current flows between said one gate and said source region through said separate region due to punch-through at a voltage lower than the breakdown voltage of said insulator layer.

2. A transistor according to claim 1, in which said semiconductor wafer is of p-type silicon and said different conductivity type is n-type.

3. A transistor according to claim 1, in which said semiconductor wafer is of n-type silicon and said different conductivity type is p-type.

4. A transistor according to claim 1, in which said transistor further comprises an island region of said different conductivity type formed in said wafer between said source and drain regions.

5. An MOS type device in an integrated array of MOS type devices with means to avoid destructive breakdown comprising: a body of semiconductive material including a substrate of a first conductivity type; a layer of insulating material covering at least a portion of a surface of said body, said layer of insulating material exhibiting destructive breakdown at a first voltage level; a layer of conductive material disposed on said layer of insulating material over said surface portion to serve as an electrode; an initial region of semiconductive material of a second conductivity type in said surface spaced from said portion; a conductive interconnection between said electrode and said initial region; said region being spaced from another region of said second conductivity type by a distance through material of said substrate of said first conductivity type to define a channel region exhibiting punch-through at a voltage level less than said voltage level, said channel region not being operated as part of an active MOS type device.

6. The subject matter of claim 5 wherein: said portion of a surface of said body is a channel region of an MOS type transistor.

7. An MOS type transistor in an integrated array of MOS type transistors with means to avoid destructive breakdown comprising: a first region of semiconductive material of a first type conductivity; second and third regions of semiconductive material of a second type of conductivity in a surface of said first region to serve as source and drain regions, said second and third regions being spaced a distance to define a channel region therebetween; a layer of insulating material covering at least said channel region, said layer of insulating material exhibiting destructive breakdown at a first voltage level; a layer of conductive material disposed on said layer of insulating material over said channel region to serve as a gate electrode; a fourth region of semiconductive material of said second type in said surface; a conductive interconnection between said gate electrode and said fourth region; said fourth region being spaced from another region of the same type by a distance to define an additional channel region exhibiting punch-through at a voltage level less than said first voltage level and a voltage level less than that at which avalanche breakdown of the diode formed by said fourth and first regions occurs, said additional channel region not being operated as part of an active MOS type device.

8. The subject matter of claim 5 wherein: said portion of a surface of said body is semiconductor region of an MOS-type capacitor.

9. The subject matter of claim 7 wherein: said another region is one of said second and third regions that has a direct interconnection to said first region.

10. The subject matter of claim 7 wherein: said another region is a fifth region that has a direct interconnection with said first region and said fourth and fifth regions are both spaced from said second and third regions by a distance greater than the spacing between said fourth and fifth regions.

11. The subject matter of claim 7 wherein: said channel region between said second and third regions is free of an inversion layer in the absence of a voltage on said gate electrodes.

12. The subject matter of claim 7 wherein: said second, third, fourth and said another region are all of the same resistivity, impurity concentration gradient and thickness.

* * * * *